United States Patent
Cai et al.

(10) Patent No.: US 8,349,716 B2
(45) Date of Patent: Jan. 8, 2013

(54) SEMICONDUCTOR DEVICE WITH REDUCED JUNCTION LEAKAGE AND AN ASSOCIATED METHOD OF FORMING SUCH A SEMICONDUCTOR DEVICE

(75) Inventors: Ming Cai, Hopewell Junction, NY (US); Christian Lavoie, Ossining, NY (US); Ahmet S. Ozcan, Pleasantville, NY (US); Bin Yang, Ossining, NY (US); Zhen Zhang, Ossining, NY (US)

(73) Assignees: International Business Machines Corporation, Armonk, NY (US); GlobalFoundries Inc., Grand Cayman (KY)

( * ) Notice: Subject to any disclaimer, the term of this patent is extended or adjusted under 35 U.S.C. 154(b) by 71 days.

(21) Appl. No.: 12/911,186

(22) Filed: Oct. 25, 2010

(65) Prior Publication Data

US 2012/0098042 A1    Apr. 26, 2012

(51) Int. Cl.
*H01L 21/336* (2006.01)
*H01L 21/04* (2006.01)

(52) U.S. Cl. .................. 438/510; 438/301; 257/E21.04; 257/E21.409

(58) Field of Classification Search .......................... None
See application file for complete search history.

(56) References Cited

U.S. PATENT DOCUMENTS

| | | | |
|---|---|---|---|
| 5,956,584 | A | 9/1999 | Wu |
| 7,682,892 | B2 | 3/2010 | Obradovic et al. |
| 2002/0155668 | A1 | 10/2002 | Lin |
| 2008/0116494 | A1* | 5/2008 | Goldbach et al. ............ 257/288 |
| 2008/0230848 | A1 | 9/2008 | Yang et al. |
| 2009/0108364 | A1 | 4/2009 | Yang et al. |

OTHER PUBLICATIONS

Kalra, Pankaj, "Advanced Source/Drain Technologies for Nanoscale CMOS" Aug. 2008, University of California Berkeley pp. 13,41,53, 126-131.*

Zhang, et al., "Schottky-Barrier Height Tuning by Means of Ion Implantation Into Preformed Silicide Films Followed by Drive-In Anneal," IEEE Electron Device Letters, vol. 28, No. 7, Jul. 2007, pp. 565-568.

Zhang, et al, "SB-MOSFETs in UTB-SOI Featuring PtSi Source/Drain With Dopant Segregation," IEEE Electron Device Letters, vol. 29, No. 1, Jan. 2008, pp. 125-127.

Khater et al., "High-K/Metal-Gate Fully Depleted SOI CMOS With Single-Silicide Schottky Source/Drain With Sub-30-nm Gate Length," IEEE Electron Device Letters, vol. 31, No. 4, Apr. 2010, pp. 275-277.

* cited by examiner

*Primary Examiner* — Seahvosh Nikmanesh
(74) *Attorney, Agent, or Firm* — Gibb & Riley, LLC; Yuanmin Cai, Esq.

(57) ABSTRACT

Disclosed is a semiconductor device having a p-n junction with reduced junction leakage in the presence of metal silicide defects that extend to the junction and a method of forming the device. Specifically, a semiconductor layer having a p-n junction is formed. A metal silicide layer is formed on the semiconductor layer and a dopant is implanted into the metal silicide layer. An anneal process is performed causing the dopant to migrate toward the metal silicide-semiconductor layer interface such that the peak concentration of the dopant will be within a portion of the metal silicide layer bordering the metal silicide-semiconductor layer interface and encompassing the defects. As a result, the silicide to silicon contact is effectively engineered to increase the Schottky barrier height at the defect, which in turn drastically reduces any leakage that would otherwise occur, when the p-n junction is in reverse polarity.

20 Claims, 10 Drawing Sheets

SEMICONDUCTOR DEVICE WITH REDUCED JUNCTION LEAKAGE AND AN ASSOCIATED METHOD OF FORMING SUCH A SEMICONDUCTOR DEVICE

BACKGROUND

1. Field of the Invention

The embodiments relate to semiconductor devices (e.g., field effect transistors, diodes, etc.) and, more specifically, to a semiconductor device with a p-n junction having reduced current leakage even in the presence of metal silicide defects that extend to (i.e., contact or traverse) the junction and an associated method of forming such a semiconductor device.

2. Description of the Related Art

In order to overcome problems associated with continued size scaling in semiconductor devices (e.g., field effect transistors, diodes, etc.), the designs for p-n junctions in such devices have become more complex. For example, in order to decrease the drain-induced barrier lowering (DIBL) associated with size scaling in field effect transistors, current designs for source/drain to channel junctions often include shallower source/drain regions, higher source/drain doping levels, halo regions, etc. Unfortunately, some of these current designs are more sensitive to defects which cause increased junction leakage and, thereby render the devices non-functional.

SUMMARY

Disclosed herein are embodiments of a semiconductor device having a p-n junction with reduced junction leakage even in the presence of metal silicide defect(s) that extend to (i.e., contact or traverse) the junction. Also disclosed are embodiments of an associated method of forming such a semiconductor device.

Specifically, the embodiments of the semiconductor device can comprise a semiconductor layer. The semiconductor layer can comprise a p-n junction. That is, the semiconductor layer can comprise a first semiconductor region and a second semiconductor region adjacent to the first semiconductor region. The first semiconductor region can be doped with a first dopant having a first conductivity type and the second semiconductor region can be doped with a second dopant having a second conductivity type that is different from the first conductivity type. Additionally, the semiconductor device can comprise a metal silicide layer on a surface of the first semiconductor region. This metal silicide layer comprise at least one metal silicide defect extending through the first semiconductor region to the second semiconductor region (i.e., contacting or traversing the p-n junction). The metal silicide layer can be doped with a third dopant. The concentration profile of the third dopant within the metal silicide layer can be such that the peak concentration of the third dopant is located within the portion of the metal silicide layer that borders the interface between the metal silicide layer and the semiconductor layer and, thus, encompasses the metal silicide defect(s). The third dopant can be preselected to have either the same conductivity type as the first dopant or to have neither the first conductivity type, nor the second conductivity type, such that a relatively high concentration of this third dopant within the metal silicide defect(s) effectively blocks any junction leakage which would otherwise occur when the junction is in reverse polarity (i.e., in a reverse biased situation). More specifically, the third dopant can be preselected such that, due to the peak concentration of the third dopant being within the metal silicide defect(s), the silicide to silicon contact is effectively engineered to increase the Schottky barrier height at the defect, which in turn drastically reduces any leakage that would otherwise occur, when the p-n junction is in reverse polarity. In one exemplary embodiment, the above-described semiconductor device can comprise a field effect transistor with a source/drain to channel p-n junction having reduced leakage even in the presence of metal silicide defect(s) that reach the junction.

Embodiments of a method of forming a semiconductor device, as described above, having a p-n junction with reduced junction leakage even in the presence of metal silicide defect(s) that reach the junction can comprise forming a semiconductor layer with a p-n junction. That is, the method embodiments can comprise forming a semiconductor layer comprising a first semiconductor region and a second semiconductor region adjacent to the first semiconductor region, where the first semiconductor region has a first conductivity type and the second semiconductor region has a second conductivity type different from the first conductivity type. Next, a metal silicide layer can be formed on a surface of the first semiconductor region and a dopant can be implanted into the metal silicide layer. This dopant can be preselected to have the same conductivity type as the first semiconductor region (i.e., the first conductivity type) or to have neither the first conductivity type, nor the second conductivity type. Then, an anneal process can be performed so as to cause the dopant within the metal silicide layer to migrate toward the interface between the metal silicide layer and the semiconductor layer, preferably, without crossing over the interface. This anneal process is specifically performed to adjust the concentration profile of the dopant within the metal silicide layer so as to ensure that the peak concentration of the dopant is within the portion of the metal silicide layer bordering the interface. It should be noted that this portion of the metal silicide layer with the peak concentration of the dopant will necessarily encompass any metal silicide defect created during the metal silicide formation process and extending through the first semiconductor region to the second semiconductor region (i.e., contacting or traversing the p-n junction). Thus, if any metal silicide defects are created during the metal silicide formation process, the relatively high concentration of dopant forced into those defects will effectively block any junction leakage that would otherwise occur when the junction is in reverse polarity (i.e., in a reverse biased situation). More specifically, due to the peak concentration of the dopant being within the metal silicide defect(s) that extend to the p-n junction, the silicide to silicon contact is effectively engineered to increase the Schottky barrier height at the defect, which in turn drastically reduces any leakage that would otherwise occur, when the p-n junction is in reverse polarity.

In one exemplary method embodiment, the semiconductor device that is formed can comprise a field effect transistor with a source/drain to channel p-n junction having reduced leakage even in the presence of metal silicide defects that extend to (i.e., contact or traverse) the junction. Specifically, in this exemplary method embodiment, a semiconductor layer with a source/drain to channel p-n junction can be formed. That is, a semiconductor layer can be formed such that it comprises a source/drain region and a channel region adjacent to the source/drain region, where the source/drain region is doped with a first dopant, having a first conductivity type, and the channel region is doped with a second dopant, having a second conductivity type. A dopant activation anneal process (e.g., a thermal anneal process) can be performed so as to activate the first dopant in the source/drain region and the second dopant in the channel region. After the dopant activation anneal process is performed, a metal silicide layer can be formed on a surface of the source/drain region. Then, a third dopant can be implanted into the metal silicide layer. This third dopant can be preselected either to have the same conductivity type as the first dopant (i.e., the first conductivity type) or to have neither the first conductivity type, nor the second conductivity type. Then, an additional anneal process (e.g., an additional thermal anneal process, a laser anneal process, a flash anneal process, etc.) can be performed so as to cause the third dopant within the metal silicide layer to migrate toward the interface between the metal silicide layer and the semiconductor layer, preferably, without crossing over the interface. This additional anneal process can specifically be performed to adjust the concentration profile of the third dopant in the metal silicide layer so as to ensure that the peak concentration of the third dopant is within the portion of the metal silicide layer bordering the interface. It should be noted that this portion of the metal silicide layer having the peak concentration of the third dopant will necessarily encompass any metal silicide defect created during metal silicide formation and extending through the source/drain region to the channel region (i.e., contacting or traversing the source/drain to channel p-n junction). Thus, if any metal silicide defects are created during metal silicide formation, the relatively high concentration of the third dopant forced into those defects will effectively block any junction leakage that would otherwise occur when the junction is in reverse polarity (i.e., in a reverse biased situation). More specifically, due to the peak concentration of the third dopant being within the metal silicide defect(s) that extend to the source/drain to channel p-n junction, the silicide to silicon contact is effectively engineered to increase the Schottky barrier height at the defect, which in turn drastically reduces any leakage that would otherwise occur, when the p-n junction is in reverse polarity.

DETAILED DESCRIPTION

As mentioned above, in order to overcome problems associated with continued size scaling in semiconductor devices (e.g., field effect transistors, diodes, etc.), the designs for p-n junctions in such devices have become more complex. For example, in order to decrease the drain-induced barrier lowering (DIBL) associated with size scaling in field effect transistors, the current designs for source/drain to channel junctions often include shallower source/drain regions, higher source/drain doping levels, halo regions, etc. Unfortunately, some of these current designs are more sensitive to defects which cause increased junction leakage (i.e., current leakage through the p-n junction).

Figure 13:
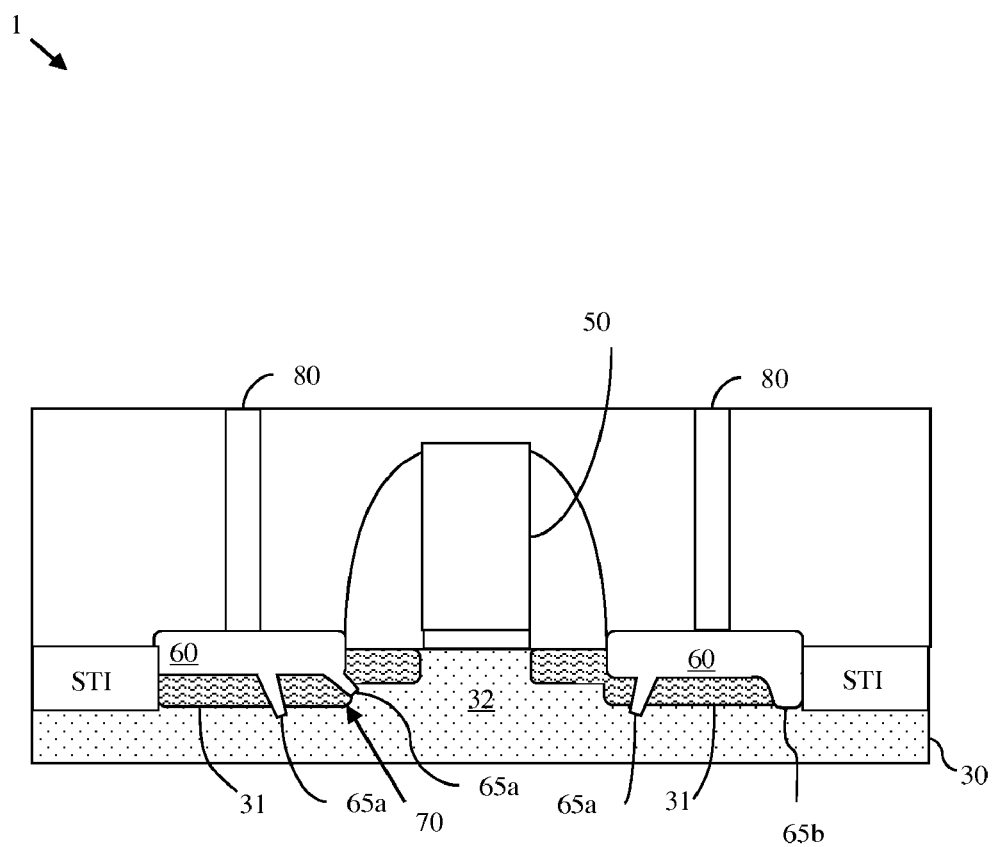
FIG. 13 is a cross-section diagram illustrating a field effect transistor with metal silicide defects extending to the source/drain to channel p-n junction.

For example, referring to FIG. 13, in a field effect transistor 1 with a relatively shallow source/drain 31 to channel 32 junction 70 metal silicide defects 65 can result in shorts which cause junction leakage. Specifically, field effect transistors are often formed with metal silicide layers 60 on the top surfaces of the source/drain regions 31. Metal silicide formation techniques typically involve the deposition of a metal layer over the FET structure. Then, a silicidation anneal process (e.g., a thermal anneal process) is performed in order to cause metal atoms from the metal layer to react with the silicon material below (i.e., with silicon in the source/drain regions) and, thereby create the metal silicide layers 60 at the metal-silicon interfaces with the source/drain regions 31. Unfortunately, such metal silicide formation techniques can result in the formation of metal silicide defects with a variety of different origins.

For example, metal silicide defects 65a (also referred to as metal silicide pipe defects) can be caused by localized overgrowths of metal silicide material on preexisting defects in the silicon. Specifically, such defects 65a form because of much faster diffusion along defects within the silicon source/drain regions 31. Additionally, metal silicide defects 65b (also referred to as metal silicide-filled divot defects) can be caused by the topography of the exposed silicon in the source/drain regions 31 or the topography of the structure (e.g., a shallow trench isolation (STI) region) next to the exposed silicon in the source/drain regions 31. As a function of the topography, the metal deposition is non-uniform and extra metal at the edges of the source/drain regions 31 can cause an over silicidation and, thereby an increased likelihood that the defect 65b will reach the p-n junction.

It should be understood that metal silicide defects 65a-b are just two of the types of defects that can occur during metal silicide formation. Those skilled in the art will recognize that other types of defects (not shown) could also occur. For example, if the substrate comprises a heterostructure with, for example, a silicon carbide to silicon interface of a silicon germanium to silicon interface, defects can be amplified at the interface due to different diffusion rates of metal atoms through the different materials and the interface itself is a fast diffusion path. In any case, when the source/drain regions 31 are shallow, these metal silicide defects can punch through the source/drain regions 31 to the channel region 32.

For purposes of this disclosure, the term "metal silicide defects" refers to any portion of a metal silicide layer that extends completely through (i.e., pipes through, projects through, etc.) a first semiconductor region on which it is formed to a second semiconductor region, particularly where the first and second semiconductor regions have different conductivity types and, thus form a p-n junction. Thus, the term "metal silicide defect" encompasses metal silicide defects originating from preexisting defects in the silicon on which the metal silicide is formed (e.g., the metal silicide pipe defects 65a), metal silicide defects originating from a local increase in metal availability at edges of three-dimensional structures (e.g., the metal silicide defects 65b caused by metal filled divots) or metal silicide defects originating from any other source.

Referring again to FIG. 13, these metal silicide defects 65a-b can effectively create shorts between the channel region 32 and source/drain contacts 80 landing on the metal silicide layers 60. Such shorts can result in large leakage currents and can, thereby render the transistor non-functional. Prior art references which addressed the issue of metal silicide defects generally focus on either the avoidance of defect formation or on defect detection techniques for quality assurance purposes. It would, however, be advantageous over the prior art to provide a cost-efficient method to reduce junction leakage in the presence of such metal silicide defects and, thereby to render otherwise non-functional transistors functional.

In view of the foregoing, disclosed herein are embodiments a semiconductor device having a p-n junction with reduced junction leakage even in the presence of metal silicide defects (e.g., metal silicide pipe defects, metal silicide-filled divot defects, or any other type of metal silicide defects) that extend to (i.e., contact or traverse) the junction. Also disclosed is an associated method of forming such a semiconductor device. Specifically, a semiconductor layer having a p-n junction can be formed. Then, a metal silicide layer can be formed on the semiconductor layer and a dopant can be implanted into the metal silicide layer. Next, an anneal process (e.g., a thermal anneal process, laser anneal process, flash anneal process, or other suitable anneal process) can be performed causing the dopant to migrate toward the metal silicide-semiconductor layer interface, preferably, without crossing over the interface. This anneal process ensures that the peak concentration of the dopant will be within a portion of the metal silicide layer which borders the metal silicide-semiconductor layer interface and which encompasses any metal silicide defects that extend to (i.e., contact or traverse) the p-n junction. A relatively high concentration of dopant forced into metal silicide defects can effectively block any junction leakage that would otherwise occur, when the junction is in reverse polarity. More specifically, due to the peak concentration of the dopant being within the metal silicide defect(s) that extend p-n junction, the silicide to Si contact is effectively engineered to increase the Schottky barrier height at the defect, which in turn drastically reduces any leakage that would otherwise occur, when the p-n junction is in reverse polarity.

Figure 1:
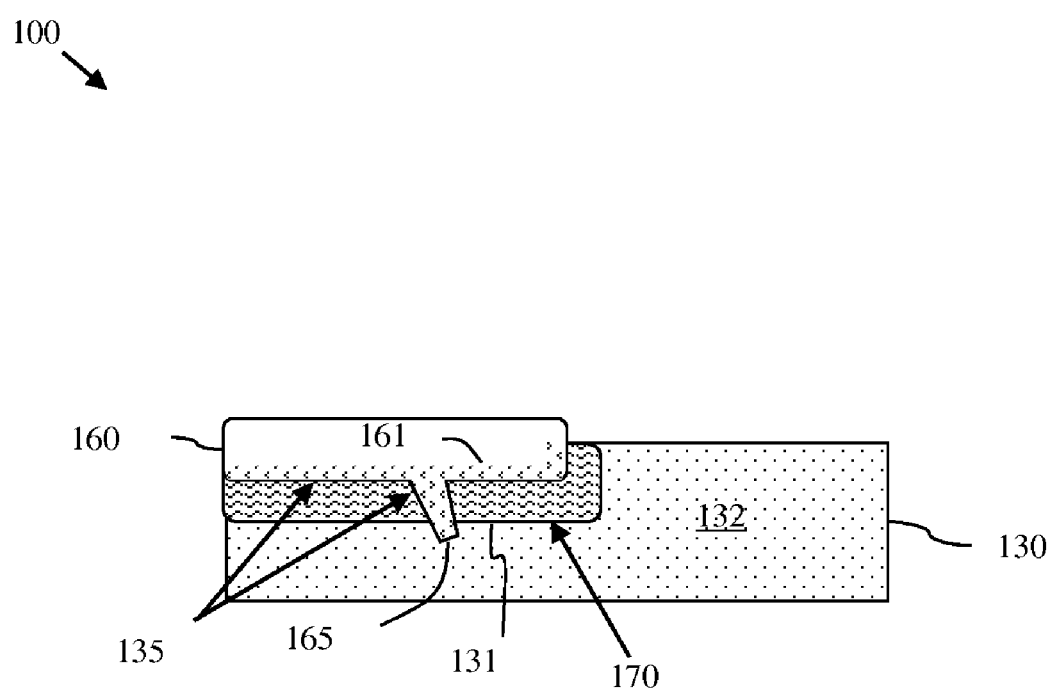
FIG. 1 is a cross-section diagram illustrating an embodiment of a semiconductor device according to the present invention.

FIG. 1 illustrates generally the embodiments of a semiconductor device 100 with a p-n junction 170 having reduced junction leakage even in the presence of metal silicide defects 165 (e.g., metal silicide pipe defects, metal silicide-filled divot defects or any other type of metal silicide defects) that extend to (i.e., contact or traverse) the junction 170. This device 100 can comprise a semiconductor layer 130 (e.g., a silicon layer). The semiconductor layer 130 can comprise a p-n junction 170. That is, the semiconductor layer 130 can comprise a first semiconductor region 131 and a second semiconductor region 132 adjacent to the first semiconductor region 131. The first semiconductor region 131 can have a first conductivity type and the second semiconductor region 132 have a second conductivity type that is different from the first conductivity type.

Additionally, the device 100 can comprise a metal silicide layer 160 positioned adjacent to a surface of the first semiconductor region 131. This metal silicide layer 160 can comprise at least one metal silicide defect 165 (e.g., a metal silicide pipe defect, a metal silicide-filled divot defect or any other type of metal silicide defect) that extends through the first semiconductor region 131 to the second semiconductor region 132 (i.e., that contacts or traverses the p-n junction 170). The metal silicide layer 160 can be doped with a dopant 161. The concentration profile of the dopant 161 within the metal silicide layer 160 can be such that the peak concentration of the dopant 161 is located within the portion of the metal silicide layer 160 which borders the interface 135 between the metal silicide layer 160 and the semiconductor layer 130 and which encompasses the metal silicide defect(s) 165.

This dopant 161 can have the same conductivity type as the first semiconductor region 131 (i.e., the first conductivity type) and can comprise either the same dopant as in the first semiconductor region 131 or a different dopant. Alternatively, this dopant 161 can have neither the first conductivity type, nor the second conductivity type. For example, the dopant 161 can comprise fluorine (F) selenium (Se) or sulfur (S). In any case, the dopant 161 can be preselected such that a relatively high concentration of this dopant 161 within the metal silicide pipe defect(s) 165 effectively blocks any junction leakage which would otherwise occur (i.e., blocks current from passing through the defect 165) when the junction is in reverse polarity (i.e., in a reverse biased situation). More specifically, the dopant 161 can be preselected such that, due to the peak concentration of the third dopant 161 being within the metal silicide defect(s) 165 that extend to the p-n junction, the p-n junction 170 is effectively engineered to increase the Schottky barrier height, which in turn drastically reduces any leakage that would otherwise occur, when the junction is in reverse polarity.

The metal silicide layer structure described above and illustrated in FIG. 1 can be incorporated into any semiconductor device (e.g., a planar field effect transistor, a non-planar field effect transistor, a diode, a solar cell, etc.) having a p-n junction, where the p-n junction may be subject to metal silicide defects.

Figure 2:
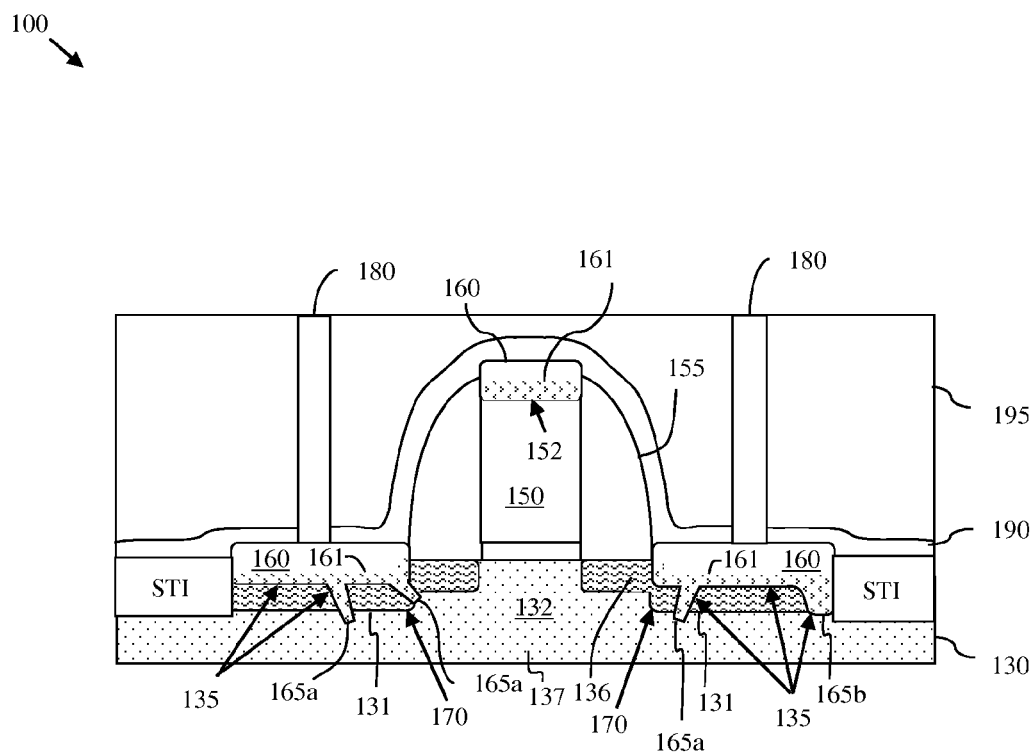
FIG. 2 is a cross-section diagram illustrating an embodiment of a field effect transistor according to the present invention.

For example, FIG. 2 illustrates one exemplary embodiment, where the semiconductor device 100 specifically comprises a planar field effect transistor (FET). This planar FET can comprise a semiconductor layer 130. This semiconductor layer 130 can comprise, for example, a bulk semiconductor layer (e.g., a bulk silicon layer) (as shown) or, alternatively, a semiconductor layer of a semiconductor-on-insulator (SOI) wafer (e.g., a silicon layer of a silicon-on-insulator wafer). Shallow trench isolation (STI) regions can define the active region of the semiconductor layer 130 and this active region can comprise source/drain regions 131 and a channel region 132 positioned between the source/drain regions 131.

The source/drain regions 131 can be doped with a first dopant 136 having a first conductivity type and the channel region 132 can be doped with a second dopant 137 having a second conductivity type. In the case of an n-type field effect transistor (i.e., an NFET), the source/drain regions 131 can be doped with an N-type dopant (e.g., a Group V dopant, such as arsenic (As), phosphorous (P) or antimony (Sb)) and the channel 132 can be doped with a P-type dopant (e.g., a Group III dopant, such as boron (B) or indium (In), or boron fluoride ($BF_2$)). In the case of a p-type field effect transistor, the source/drain regions 131 can be doped with a P-type dopant (e.g., a Group III dopant, such as boron (B) or indium (In)) and the channel region 132 can be doped with a n-type dopant (e.g., a Group V dopant, such as arsenic (As), phosphorous (P) or antimony (Sb)). Thus, the junctions 170 between the channel region 132 and the source/drain regions 131 can comprise p-n junctions.

It should be understood that various different configurations for both source/drain regions 131 and channel regions 132 are well-known in the art and can be incorporated into the FET structure of the present invention. For example, the source/drain regions 131 can comprise dopant implant regions, recesses filled with in-situ doped or subsequently implanted epitaxial semiconductor material, raised source/drain regions, lightly doped source/drain extension regions in combination with heavily doped deep source/drain regions, etc. Additionally, the channel region 132 can comprise an implanted well region, can include halo regions, etc.

A gate structure 150 can be positioned above the channel region 132 of the semiconductor layer 130. This gate structure 150 can comprise a gate dielectric layer (e.g., an oxide layer, a high-k gate dielectric layer or any other suitable gate dielectric layer) and a gate conductor layer on the gate dielectric layer (e.g., a polysilicon layer, a metal layer or any other suitable gate conductor layer). Gate sidewall spacers 155 can be positioned on opposing sides of the gate structure 150.

Metal silicide layers 160 can be positioned on the top surface of the source/drain regions 131 positioned laterally adjacent to the gate sidewall spacers 155. In the case of a polysilicon gate conductor, a metal silicide layer 160 can also optionally be positioned on the top surface of the gate structure 150. These metal silicide layers 160 can comprise, for example, a silicide of a refractory or noble metal (e.g., nickel, cobalt, tungsten, chromium, platinum, titanium, molybdenum, palladium, etc.) or an alloy thereof.

One or more dielectric layers 190, 195 (i.e., interlayer dielectrics, such as silicon dioxide, silicon nitride, borophosphosilicate glass (BPSG), etc.) can cover the FET structure, including the metal silicide layers 160. Contacts 180 to the source/drain regions 131 and gate structure 150 (not shown) can extend vertically through these dielectric layer(s) 190, 195, landing on the metal silicide layers 160.

Additionally, any one or more of these metal silicide layers 160 can comprise metal silicide defects, including metal silicide pipe defects 165a, metal silicide-filled divot defects 165b or any other type of metal silicide pipe defects. In the case of a metal silicide layer 160 on a source/drain region 131, such metal silicide defect(s) 165a-b can extend through the source/drain region 131 to the adjacent channel region 132. That is, the metal silicide defect(s) 165a-b can extend to (i.e., contact or traverse) the source/drain to channel p-n junction 170.

To avoid a short between the channel region 132 and source/drain contacts 180 resulting from the metal silicide defect(s) 165a-b, the metal silicide layer 160 can be doped with a third dopant 161. The concentration profile of this third dopant 161 within the metal silicide layer 160 can be such that the peak concentration of the third dopant 161 is located within the portion of the metal silicide layer 160 bordering the interface 135 between the metal silicide layer 160 and the semiconductor layer 130. Thus, the portion of the metal silicide layer 160 with the peak concentration of the third dopant 161 encompasses any metal silicide defect(s) 165a-b.

The third dopant 161 can have the first conductivity type and can be either the same dopant as the first dopant 136 in the source/drain regions 131 or a different dopant from the first dopant 136. For example, in the case of an NFET, the third dopant 161 can comprise an n-type dopant (e.g., a Group V dopant, such as arsenic (As), phosphorous (P) or antimony (Sb)), whereas in the case of a PFET, the third dopant can comprise a P-type dopant (e.g., a Group III dopant, such as boron (B) or indium (In), or boron fluoride ($BF_2$)). Alternatively, the third dopant 161 can be neither an n-type dopant, nor a p-type dopant. For example, the third dopant 161 can comprise fluorine (F), selenium (Se) or sulfur (S). In any case, the third dopant 161 can be preselected so that the relatively high concentration of this third dopant 161 within the metal silicide defect(s) 165 effectively blocks any junction leakage which would otherwise occur (i.e., effectively blocks current from passing through the defect(s) 165) when the junction is in reverse polarity (i.e., in a reverse biased situation). More specifically, due to the peak concentration of the third dopant 161 being within the metal silicide defect(s) 165a-b that extend to the source/drain to channel p-n junction 170, the source/drain to channel p-n junction 170 is effectively engineered to increase the Schottky barrier height, which in turn drastically reduces any leakage that would otherwise occur, when the junction is in reverse polarity.

Figure 3:
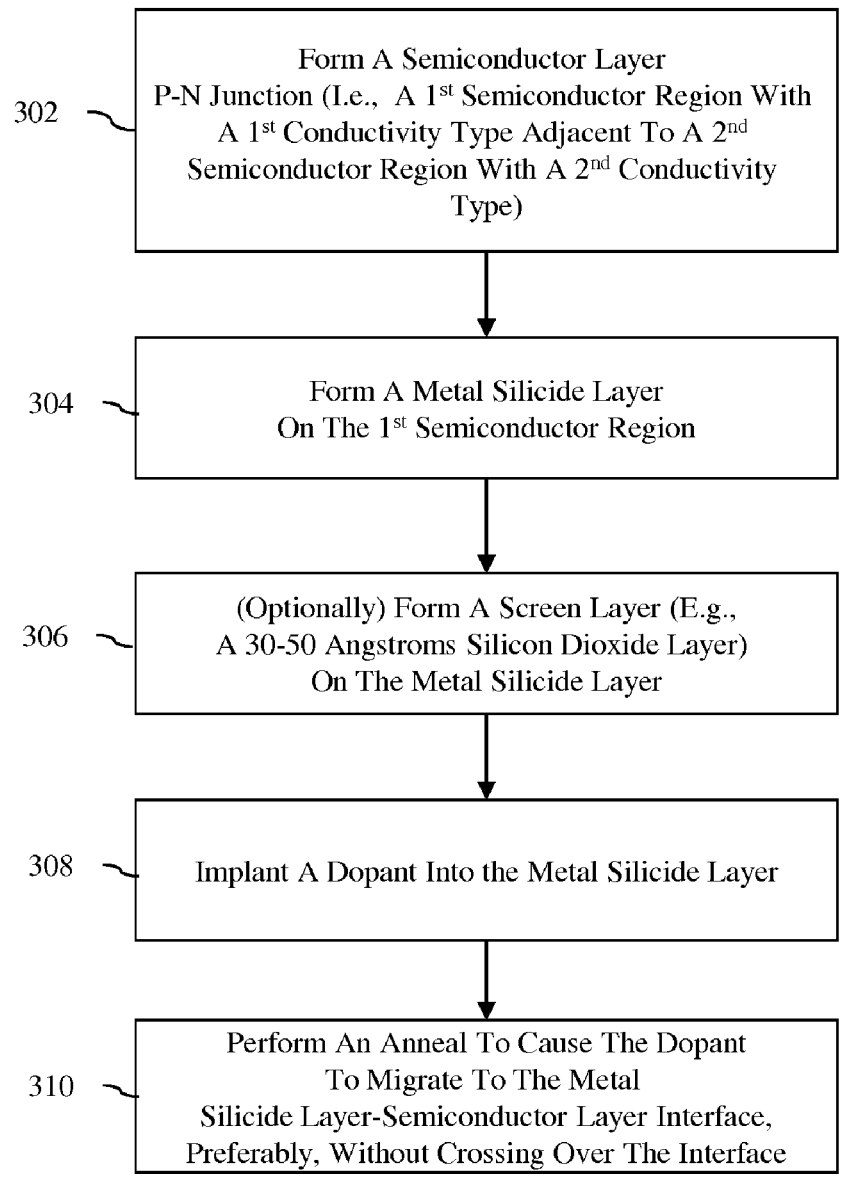
FIG. 3 is a flow diagram illustrating an embodiment of a method of forming the semiconductor device of FIG. 1.

FIG. 3 is a flow diagram illustrating embodiments of a method of forming a semiconductor device 100, such as that illustrated in FIG. 1, with a p-n junction 170 having reduced junction leakage even in the presence of metal silicide defects 165 (e.g., metal silicide pipe defects, metal silicide-filled divot defects, or any other type of metal silicide defects) that extend to (i.e., contact or traverse) the junction. The method embodiments can comprise using conventional processing techniques to form a semiconductor layer with a p-n junction (302). That is, the method embodiments can comprise forming a semiconductor layer comprising a first semiconductor region and a second semiconductor region adjacent to the first semiconductor region, where the first semiconductor region has a first conductivity type and the second semiconductor region has a second conductivity type different from the first conductivity type.

Next, conventional processing techniques can be used to form a metal silicide layer on a surface of the first semiconductor region (304). As discussed above, oftentimes these conventional processing techniques can result in the formation of metal silicide defects (e.g., metal silicide pipe defects, metal silicide-filled divot defects, or any other type of metal silicide defects), which in turn create shorts across the p-n junction.

Optionally, after the metal silicide layer is formed at process 304, a screen layer can be formed on the metal silicide layer (306). For example, a 30-50 angstrom (Å) silicon dioxide ($SiO_2$) layer can be formed, for example, by low-pressure chemical vapor deposition (LPCVD)). Such a screen layer can protect subsequently used processing tools from metal contamination.

Next, a dopant can be implanted into the metal silicide layer (308). This dopant can be preselected so that it has the same conductivity type as the first semiconductor region (i.e., the first conductivity type) or so that it has neither the first, nor the second conductivity type (e.g., fluorine (F), selenium (Se) or sulfur (S)). The dopant implant process 308 can comprise a relatively low energy dopant implant process designed to avoid implantation of dopant into the semiconductor layer below. However, it should be noted that if a screen layer was previously formed on the metal silicide layer at process 306, then at process 308 the dopant will have to pass through the screen layer into the metal silicide layer and a higher dopant implant energy can be used (e.g., for decreased processing time) while still avoiding dopant implantation into the semiconductor layer below.

After the metal silicide layer is implanted with the dopant at process 308, an anneal process is performed (310). Specifically, this anneal process 310 can comprise a thermal anneal process, a laser anneal process, a flash anneal process or any other suitable anneal process performed so as to cause the dopant within the metal silicide layer to migrate toward the interface between the metal silicide layer and the semiconductor layer, thereby adjusting the concentration profile of the dopant so that the peak concentration of the dopant is within the portion of the metal silicide layer that borders the interface, preferably, without forcing the dopant across the interface.

For example, the anneal process 310 can comprise a relatively low temperature thermal anneal process (e.g., with a temperature ranging from 400° C.-700° C.) for a relatively short period of time (e.g., from 1-30 seconds), where the temperature is preselected to be lower than the melting temperature of the metal silicide layer and further where the combination of time and temperature are pre-selected to avoid significant diffusion of the dopant into the semiconductor layer 130 below the metal silicide layer-semiconductor layer interface. Alternatively, the anneal process 310 can comprise a different type of anneal process (e.g., a laser anneal or flash anneal) performed at a higher temperature (e.g., 600° C.-900° C.) for a shorter period of time (e.g., a sub-second time period), where the combination of time and temperature are similarly pre-selected to avoid melting the metal silicide layer and further to avoid significant diffusion of the dopant into the semiconductor layer 130 below the metal silicide layer-semiconductor layer interface.

It should be noted that in the resulting structure the portion of the metal silicide layer that has the peak concentration of the dopant will encompass any metal silicide defect, which was previously created during metal silicide formation at process 304 and which extends through the first semiconductor region to the second semiconductor region (i.e., which traverses the p-n junction). Thus, if any metal silicide defects were created during the metal silicide formation at process 304, the relatively high concentration of dopant forced into those defects by the anneal at process 310 will effectively block any junction leakage that would otherwise occur (i.e., will effectively block current from passing through the defects) when the device is in reverse polarity (i.e., in a reverse biased situation). More specifically, due to the peak concentration of the dopant being within the metal silicide defect(s) that extend to the p-n junction, the p-n junction is effectively engineered to increase the Schottky barrier height, which in turn drastically reduces any leakage that would otherwise occur, when the junction is in reverse polarity.

The process steps described above and illustrated in FIG. 3 can incorporated into any set of process steps used to form a semiconductor device (e.g., a planar field effect transistor, a non-planar field effect transistor, a diode, a solar cell, etc.) having a p-n junction, where the p-n junction may be subject to metal silicide defects.

Figure 4:
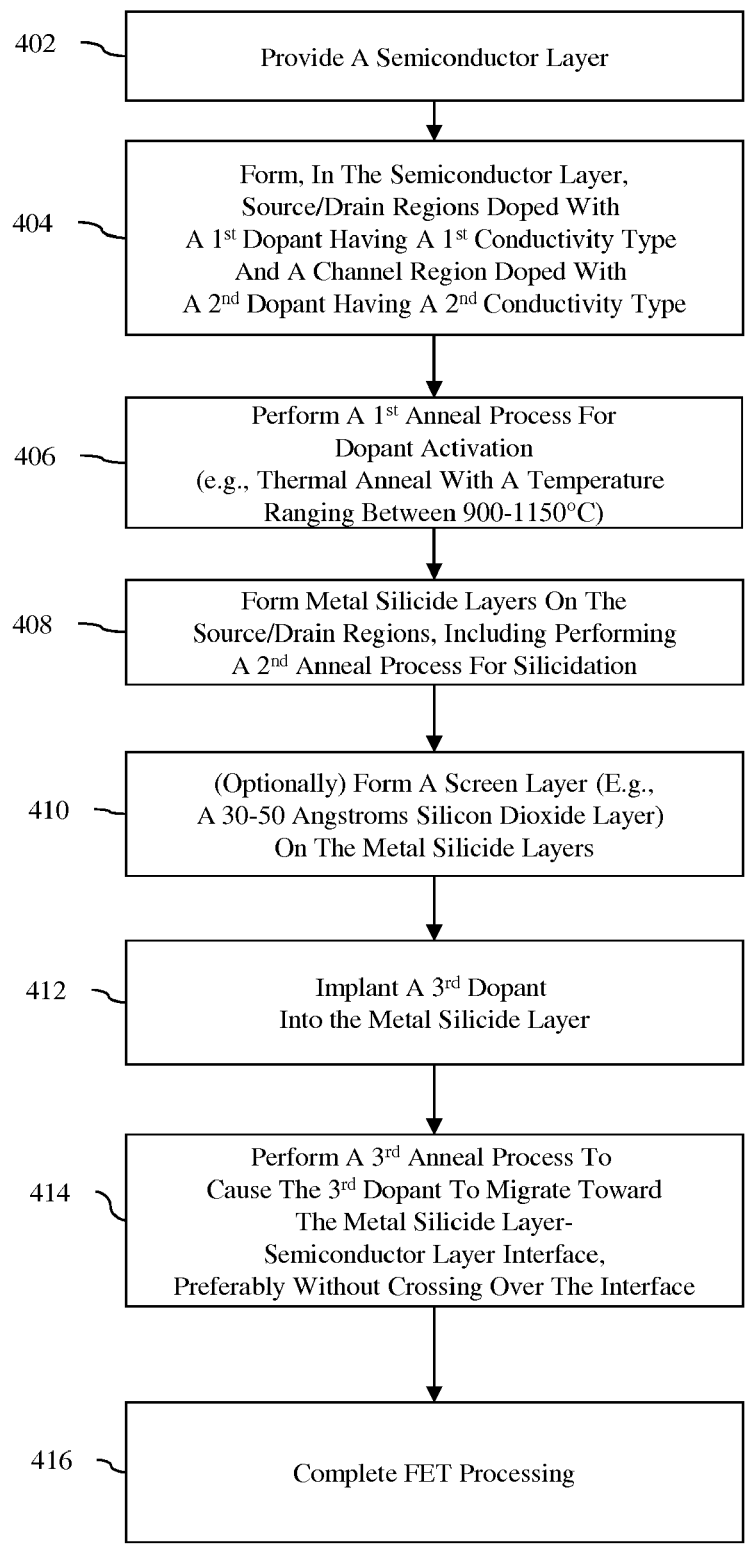
FIG. 4 is a flow diagram illustrating an embodiment of a method of forming the field effect transistor of FIG. 2.

For example, FIG. 4 is a flow diagram illustrating one exemplary method embodiment, where the semiconductor device that is formed comprises a planar FET, such as the planar FET illustrated in FIG. 2, with the source/drain 131 to channel 132 p-n junctions 170 having reduced leakage even in the presence of metal silicide defects 165a-b (e.g., metal silicide pipe defects, metal silicide-filled divot defects, or any other type of metal silicide defect) that extend to (i.e., contact or traverse) the junctions 170. This method embodiment can comprise providing a semiconductor layer 130. The semiconductor layer 130 can comprise, for example, a bulk semiconductor layer (e.g., a bulk silicon layer) (as shown) or, alternatively, a semiconductor layer of a semiconductor-on-insulator (SOI) wafer (e.g., a silicon layer of a silicon-on-insulator wafer).

Figure 5:
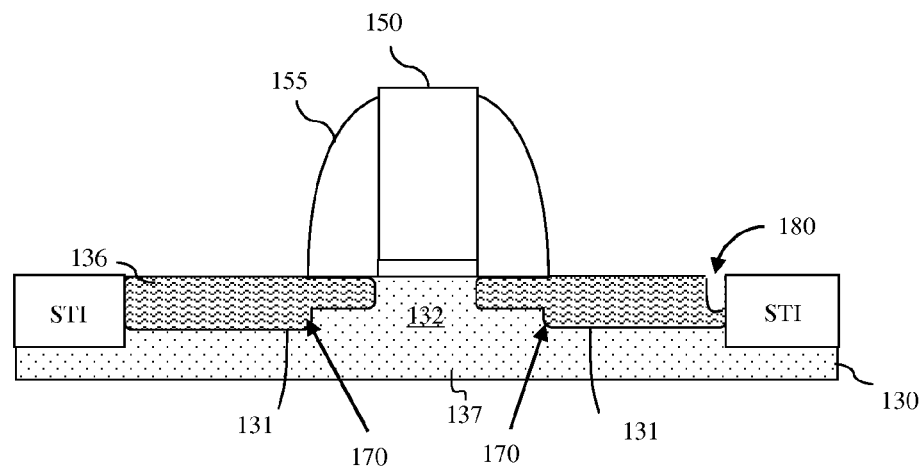
FIG. 5 is a cross-section diagram illustrating a partially completed field effect transistor formed according to the method of FIG. 4.

Next, within the semiconductor layer 130, source/drain regions 131 doped with a first dopant 136, having a first conductivity type, and a channel region 132 doped with a second dopant 137, having a second conductivity type different from the first conductivity type, can be formed such that the channel region 132 is disposed between the source/drain regions 131, thereby creating source/drain to channel p-n junctions 170 (404, see FIG. 5). The source/drain regions 131 and channel region 132 can be formed within the semiconductor layer 130 at process 404 using conventional processing techniques.

Specifically, the semiconductor layer 130 itself (as shown) or a well portion of the semiconductor layer 130 can be doped with the second dopant 137. Next, a gate structure 150 can be formed on the top surface of the semiconductor layer 130 over a designated channel region 132. That is, a gate dielectric layer (e.g., a silicon dioxide layer, a high-k dielectric layer or any other suitable gate dielectric layer) can be formed (e.g., deposited) on the top surface of the semiconductor layer 130. Then, a gate conductor layer (e.g., a doped polysilicon layer, a metal layer, any other suitable conductor layer or combination thereof) can be formed (e.g., deposited) on the gate dielectric layer. The gate dielectric layer-gate conductor layer stack can then be patterned, e.g., using lithographic patterning techniques, in order to form the gate structure 150. Optionally, after the gate structure 150 is formed at process 404, shallow source/drain extension regions and/or halo regions (not shown) can be formed (e.g., implanted) in the semiconductor layer 130 on opposite sides of the channel region 132. Next, gate sidewall spacers 155 can be formed on the opposing sidewalls of the gate structure 150 and source/drain regions 131 can be formed in the semiconductor layer 130 adjacent to the gate sidewall spacers 155. For example, the source/drain regions 131 can be formed by implanting the first dopant 136 into the exposed regions of the semiconductor layer 130 adjacent to the gate sidewall spacers 155. Alternatively, recesses can be formed in the exposed regions of the semiconductor layer 130 adjacent to the gate sidewall spacers 155 and then filled with in-situ doped or subsequently implanted epitaxial semiconductor material. Additionally or alternatively, epitaxial semiconductor material can be formed in the exposed regions of the semiconductor layer adjacent to the gate sidewall spacers 155 and either in-situ or subsequently doped to form raised source/drain regions. Source/drain region formation techniques are well-known in the art. Thus, the details of such techniques have been omitted from this specification in order to allow the reader to focus on the salient aspects of the invention.

It should be noted that in the case of an n-type field effect transistor (i.e., an NFET), the source/drain regions 131 can be doped with an N-type dopant (e.g., a Group V dopant, such as arsenic (As), phosphorous (P) or antimony (Sb)) and the channel region 132 can be doped with a P-type dopant (e.g., a Group III dopant, such as boron (B) or indium (In), or boron fluoride ($BF_2$)). In the case of a p-type field effect transistor, the source/drain regions 131 can be doped with a P-type dopant (e.g., a Group III dopant, such as boron (B) or indium (In), or boron fluoride ($BF_2$)) and the channel region 132 can be doped with a n-type dopant (e.g., a Group V dopant, such as arsenic (As), phosphorous (P) or antimony (Sb)).

Figure 6:
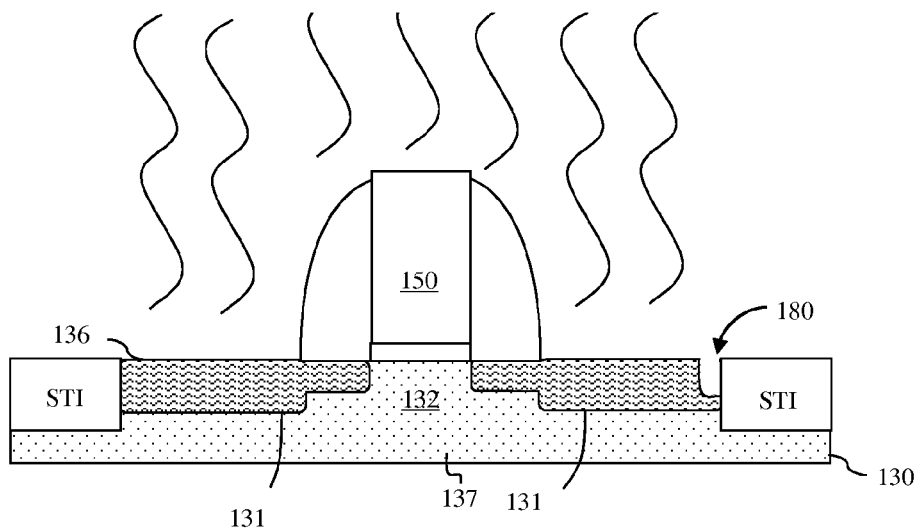
FIG. 6 is a cross-section diagram illustrating a partially completed field effect transistor formed according to the method of FIG. 4.

After the source/drain regions 131 are formed, a first anneal process (i.e., a dopant activation anneal process, such as a thermal anneal process) can be performed so as to activate the first dopant 136 in the source/drain regions 131 as well as the second dopant 137 in the channel region 132 (406, see FIG. 6). Specifically, in this dopant activation anneal process 406, the temperature must be sufficiently high (e.g., between 900° C. and 1150° C. in the case of a thermal anneal process) to cause dopant atoms to replace silicon atoms in the lattice of the semiconductor layer 130 within the source/drain regions 131 and, thereby to alter the conductivity of the source/drain regions 131.

Figure 7:
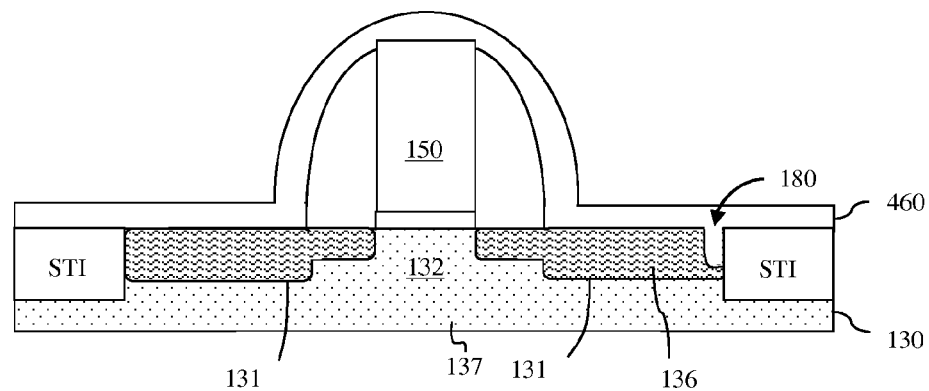
FIG. 7 is a cross-section diagram illustrating a partially completed field effect transistor formed according to the method of FIG. 4.
Figure 8:
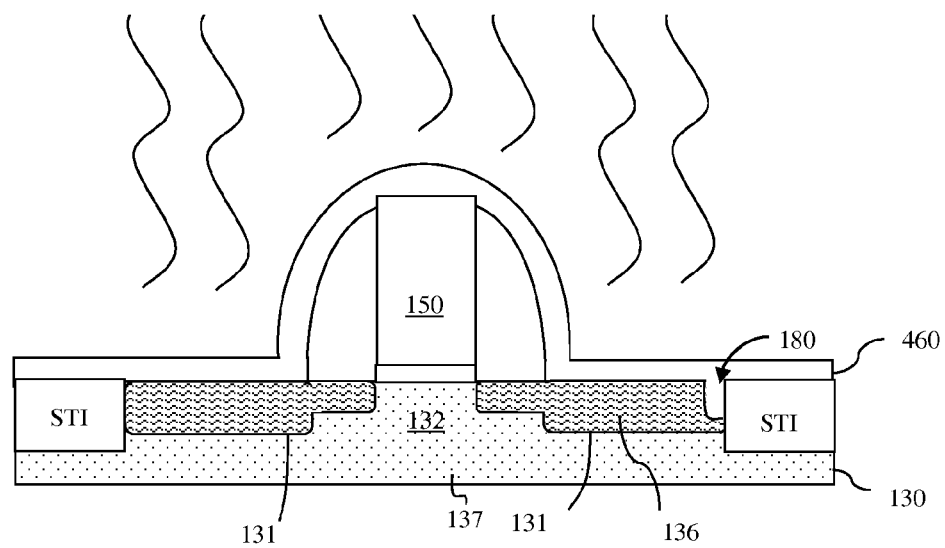
FIG. 8 is a cross-section diagram illustrating a partially completed field effect transistor formed according to the method of FIG. 4.

After the dopant activation anneal is performed at process 406, conventional processing techniques can be used to form metal silicide layers 160 on the top surface of the source/drain regions 131 and, optionally, on the gate structure 150 (e.g., if the gate conductor comprises a polysilicon gate conductor) (408). That is, a metal layer 460 (e.g., a layer of a refractory or noble metal, such as nickel, cobalt, tungsten, chromium, platinum, titanium, molybdenum, palladium, etc., or an alloy thereof) can be deposited (e.g., by sputtering) (see FIG. 7). Then, a second anneal process (i.e., a silicidation anneal process, such as a thermal anneal process) can be performed in order to cause metal atoms from the metal layer 460 to react with the silicon material below (i.e., with silicon in the source/drain regions 131 (and, if applicable, with any polysilicon in the gate conductor) in order to create the metal silicide layers 160 at the metal-silicon interfaces (see FIG. 8).

Figure 9:
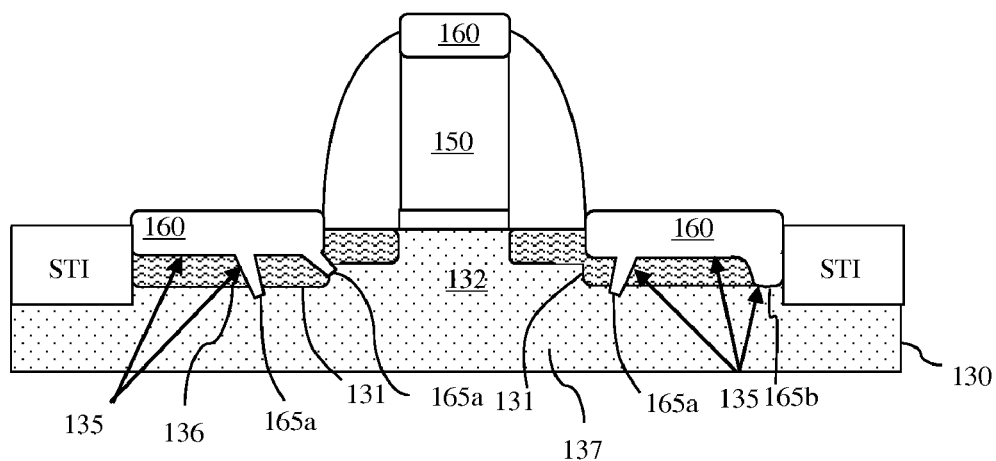
FIG. 9 is a cross-section diagram illustrating a partially completed field effect transistor formed according to the method of FIG. 4.

As discussed above, oftentimes such conventional processing techniques can result in the formation of one or more metal silicide defects. These metal silicide defects can comprise one or more metal silicide pipe defects 165a, which as discussed in detail above are localized overgrowths of metal silicide material in preexisting defects within the silicon material. Alternatively, or additionally, these metal silicide defects can comprise one or more metal silicide-filled divot defects 165b, which as discussed in detail above are divots 180 (i.e., openings, pits, cavities, etc., see FIG. 5)) on the top surfaces of source/drain regions 131 (as shown) or at the top corner of the isolation material in the shallow trench isolation (STI) regions immediately adjacent to the source/drain regions 31 and which are filled at process 408 with metal silicide material. Alternatively, or additionally, these metal silicide defects can comprise any other type of metal silicide defect (e.g., a metal silicide defect at a hetero structure interface). In any case, when the source/drain regions 131 are shallow such metal silicide defects can punch through the source/drain regions 131 to the channel region 132 (see FIG. 9). Following the silicidation anneal process, any unreacted metal can be selectively removed (e.g., by selective etch).

Those skilled in the art will recognize that the specifications for the silicidation anneal will vary depending upon the metal or metal alloy used. For example, in the case of nickel-platinum (Ni—Pt) alloy silicide formation, the silicidation process can include standard silicon surface cleaning procedures followed by deposition of a Ni-PT allow film (e.g., a 10 nm or less Ni—Pt alloy film) by conventional metal deposition techniques (e.g., sputtering, evaporation, chemical vapor deposition (CVD) or atomic layer deposition (ALD)). The deposition step is followed by a silicidation anneal (e.g., at a temperature between 250° C. and 450° C.) and then a selective etch to remove any unreacted Ni-PT. In some instance, a second silicidation anneal and second selective etch may be required.

Figure 10:
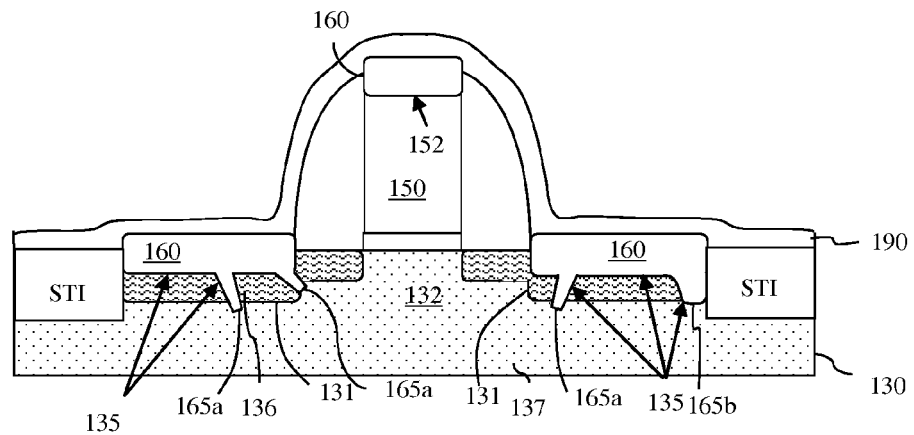
FIG. 10 is a cross-section diagram illustrating a partially completed field effect transistor formed according to the method of FIG. 4.

Optionally, after the metal silicide layers 160 are formed at process 408, a screen layer 190 can be formed over the structure and covering the metal silicide layers 160 (410, see FIG. 10). For example, a 30-50 angstrom (Å) silicon dioxide ($SiO_2$) layer can be formed, for example, by low-pressure chemical vapor deposition (LPCVD)). Such a screen layer 190 can protect subsequently used processing tools from metal contamination.

Figure 11:
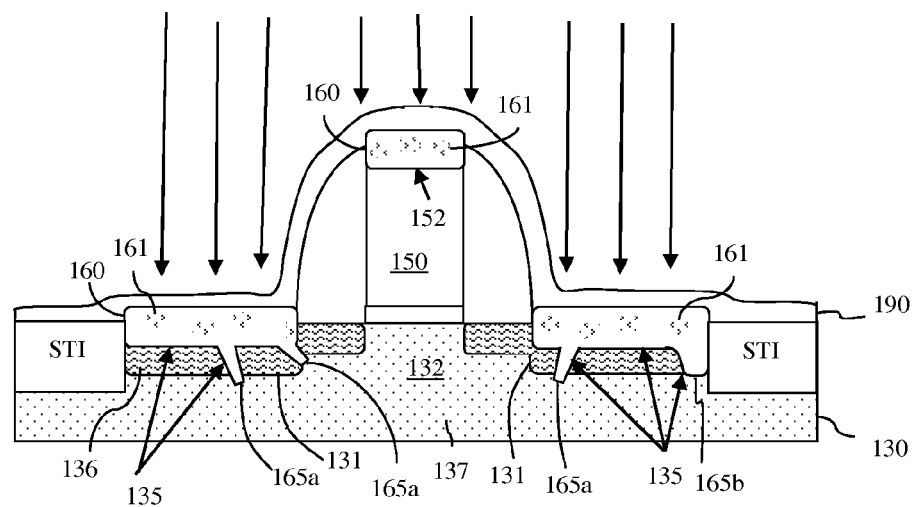
FIG. 11 is a cross-section diagram illustrating a partially completed field effect transistor formed according to the method of FIG. 4.

Next, a third dopant 161 can be implanted into the metal silicide layers 160 on top of the source/drain regions 131 (and, if applicable, on top of the gate structure 150) (412, see FIG. 11). This third dopant 161 can be preselected so that it has the same conductivity type as the source/drain regions 131 (i.e., the first conductivity type) and is either the same dopant as the first dopant 136 or a different dopant from the first dopant 136. For example, in the case of an NFET, the third dopant 161 can comprise an n-type dopant (e.g., a Group V dopant, such as arsenic (As), phosphorous (P) or antimony (Sb)), whereas in the case of a PFET, the third dopant 161 can comprise a P-type dopant (e.g., a Group III dopant, such as boron (B) or indium (In), or boron fluoride ($BF_2$)). Alternatively, the third dopant 161 can be neither an n-type dopant, nor a p-type dopant. For example, the third dopant 161 can comprise fluorine (F), selenium (Se) or sulfur (S). The dopant implant process 412 can comprise a relatively low energy implant process to avoid implantation of third dopant 161 into the semiconductor layer 130 below. However, it should be noted that if a screen layer 190 was previously formed on the metal silicide layers 160 at process 410, then the third dopant 161 will have to pass through the screen layer 190 into the metal silicide layers 160 and a higher dopant implant energy can be used (e.g., for decreased processing time) while still avoiding or at least minimizing dopant implantation into the semiconductor layer 130 below.

Those skilled in the art will recognize that the specifications for the dopant implant process may vary depending upon the materials, their thicknesses, the dopant used, etc. Thus, the dose used may vary from $1 \times 10^{14}$ cm$^{-2}$ and $5 \times 10^{15}$ cm$^{-2}$ and is preferably in the range of $1 \times 10^{15}$ cm$^{-2}$ to $3 \times 10^{15}$ cm$^{-2}$. The implantation energy may also vary depending upon the dopant and, particularly, the weight of the atom or molecule implanted and preselected such that the vast majority of atoms (>90%) stay within the silicided volume. It is anticipated that the implantation energies for typical dopants (e.g., As, B, P, $BF_2$, etc.) will remain below 10 keV. For example, As can typically be implanted at an energy of 6 keV or below, B can typically be implanted at an energy of 2 keV or below, P can typically be implanted at an energy of 4 keV or below, and BF2 can typically be implanted at an energy of 8 keV or below. These implant energies are offered for illustration purposes only, the exact energy used should be preselected by balancing the need to drive the dopant 161 into the silicide 160 with the need to avoid driving the dopant 161 across the interface 170 and, thereby, generating a significant density of defects in the silicon (when the energy is too high).

Figure 12:
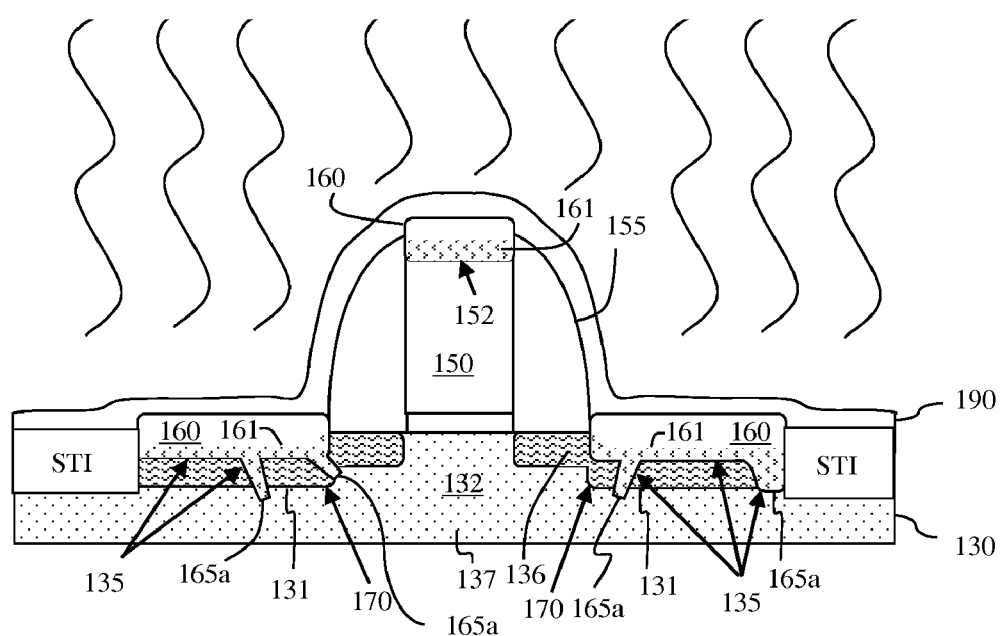
FIG. 12 is a cross-section diagram illustrating a partially completed field effect transistor formed according to the method of FIG. 4.

After the metal silicide layers 160 are implanted with the third dopant 161 at process 412, a third anneal process (i.e., a dopant migration anneal process) can be performed (414, see FIG. 12). Specifically, this third anneal process 414 can comprise a thermal anneal process, a laser anneal process, a flash anneal process or any other suitable anneal process that is performed so as to cause the third dopant 161 within each metal silicide layer 160 above the source/drain regions 131 to migrate toward the interface 135 between the metal silicide layer 160 and the semiconductor layer 130. This third anneal process 414 can be designed to adjust the concentration profile of the third dopant 161 within the metal silicide layer 160 so that the peak concentration of the third dopant 161 is within the portion of the metal silicide layer 160 that borders the interface 135 without forcing the third dopant 161 across the interface 135.

For example, the third anneal process 414 can comprise a relatively low temperature thermal anneal process (e.g., with a temperature ranging from 400° C.-700° C.) for a relatively short period of time (e.g., from 1-30 seconds), where the temperature is preselected to be lower than the melting temperature of the metal silicide layers 160 and lower than the activation anneal temperature used at process 406 and further where the combination of time and temperature are pre-selected to avoid significant diffusion of the third dopant 161 across the metal silicide layer-semiconductor layer interface 135. Alternatively, the anneal process 414 can comprise a different type of anneal process (e.g., a laser anneal or flash anneal) performed at a higher temperature (e.g., 600° C.-900° C.) for a shorter period of time (e.g., a sub-second time period), where the combination of time and temperature are similarly pre-selected to avoid melting the metal silicide layers 160 and further to avoid significant diffusion of the third dopant 161 across the metal silicide layer-semiconductor layer interface 135.

It should be noted that in the resulting structure the portions of the metal silicide layers 160 that have the peak concentration of the third dopant 161 will necessarily encompass any metal silicide defect(s) (e.g., defects 165a-b), which were previously created during metal silicide formation at process 408 and which extend through a source/drain region 131 to the channel region 132 (i.e., which contact or traverse a source/drain to channel p-n junction 170). Thus, if any metal silicide defects 165a-b are created during metal silicide layer formation at process 408, the relatively high concentration of the third dopant 161 forced into those metal silicide defects (e.g., 165a-b) will effectively block any junction leakage which would otherwise have occurred (i.e., will effectively block current from passing through the metal silicide defects) when the device is in reverse polarity (i.e., in a reverse biased situation). More specifically, due to the peak concentration of the dopant being within the metal silicide defect(s) that extend to the source/drain to channel p-n junction, the source/drain to channel p-n junction is effectively engineered to increase the Schottky barrier height, which in turn drastically reduces any leakage that would otherwise occur, when the junction is in reverse polarity.

Following the third anneal at process 414, additional processing can be performed in order to complete the FET structure (416, see FIG. 1). This additional processing can include, but is not limited to, interlayer dielectric 195 deposition, contact 180 formation, etc. Such processing techniques are well-known in the art and, thus, the details of such processing techniques are omitted from this specification in order to allow the reader to focus on the salient aspects of the embodiments described herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments a semiconductor device having a p-n junction with reduced junction leakage even in the presence of metal silicide defects (e.g., metal silicide pipe defects, metal silicide-filled divot defects, or any other type of metal silicide defects) that extend to (i.e., contact or traverse) the junction. Also disclosed is an associated method of forming such a semiconductor device. Specifically, a semiconductor layer having a p-n junction can be formed. Then, a metal silicide layer can be formed on the semiconductor layer and a dopant can be implanted into the metal silicide layer. Next, an anneal process (e.g., a thermal anneal process, a laser anneal process, a flash anneal process or other suitable anneal process) can be performed causing the dopant to migrate toward the metal silicide-semiconductor layer interface, preferably, without crossing over the interface. This anneal process ensures that the peak concentration of the dopant will be within a portion of the metal silicide layer which borders the metal silicide-semiconductor layer interface and which encompasses any metal silicide defects that extend to the p-n junction. A relatively high concentration of dopant forced into metal silicide defects can effectively block any junction leakage which would otherwise occur when the junction is in reverse polarity. More specifically, due to the peak concentration of the dopant being within the metal silicide defect(s) that extend to the p-n junction, the silicide to silicon contact is effectively engineered to increase the Schottky barrier height at the defect, which in turn drastically reduces any leakage that would otherwise occur, when the p-n junction is in reverse polarity.

What is claimed is:

1. A method of forming a semiconductor device, said method comprising:

forming a semiconductor layer comprising a first semiconductor region and a second semiconductor region adjacent to said first semiconductor region, said first semiconductor region having a first conductivity type and said second semiconductor region having a second conductivity type different from said first conductivity type;

forming a metal silicide layer on a surface of said first semiconductor region, said metal silicide layer comprising at least one pipe defect that extends through said first semiconductor region to said second semiconductor region;

implanting a dopant into said metal silicide layer, said implanting being performed at a predetermined energy level such that said dopant remains in said metal silicide layer above said semiconductor layer; and after said implanting, performing an anneal process to cause said dopant within said metal silicide layer to migrate away from a top surface of said metal silicide layer toward an interface between said metal silicide layer and said semiconductor layer such that a peak concentration of said dopant is within a portion of said metal silicide layer bordering said interface, said portion comprising said at least one pipe defect and said dopant within said at least one pipe defect reducing junction leakage through said at least one pipe defect.

2. The method of claim 1, said anneal process being performed at a temperature and for a time period pre-selected to avoid melting said metal silicide layer and to avoid migration of said dopant across said interface into said first semiconductor region and said second semiconductor region.

3. The method of claim 1, further comprising, after said forming of said metal silicide layer and, before said implanting of said dopant, forming an oxide layer on said metal silicide layer such that, during said implanting of said dopant, said dopant passes through said oxide layer into said metal silicide layer.

4. The method of claim 1, said forming of said metal silicide layer comprising forming any one of a nickel silicide layer and a nickel alloy silicide layer.

5. The method of claim 1, said anneal process comprising any one of a thermal anneal process, a laser anneal process and a flash anneal process.

6. The method of claim 1, said dopant having said first conductivity type.

7. The method of claim 1, said dopant comprising any of fluorine, selenium and sulfur.

8. The method of claim 1, said first conductivity type comprising n-type conductivity and said dopant comprising any one of arsenic, antimony and phosphorus.

9. The method of claim 1, said first conductivity type comprising p-type conductivity and said dopant comprising boron.

10. The method of claim 1, said dopant comprising fluorine.

11. A method of forming a field effect transistor, said method comprising:
    forming a semiconductor layer comprising a source/drain region and a channel region adjacent to said source/drain region, said source/drain region being doped with a first dopant, having a first conductivity type, and said channel region being doped with a second dopant, having a second conductivity type;
    performing a first anneal process so as to activate said first dopant in said source/drain region;
    after said performing of said dopant activation anneal process, forming a metal silicide layer on a surface of said source/drain region, said metal silicide layer comprising at least one pipe defect that extends through said source/drain region to said channel region and said forming of said metal silicide layer comprising performing a second anneal process;
    implanting a third dopant into said metal silicide layer, said implanting of said third dopant being performed at a predetermined energy level such that said dopant remains in said metal silicide layer above said semiconductor layer; and
    after said implanting of said third dopant, performing a third anneal process to cause said third dopant within said metal silicide layer to migrate away from a top surface of said metal silicide layer toward an interface between said metal silicide layer and said semiconductor layer such that a peak concentration of said third dopant is within a portion of said metal silicide layer bordering said interface, said portion comprising said at least one pipe defect and said third dopant within said at least one pipe defect reducing junction leakage through said at least one pipe defect.

12. The method of claim 11, said third anneal process being performed at a temperature and for a time period pre-selected to avoid melting said metal silicide layer and to avoid migration of said dopant across said interface into said first semiconductor region and said second semiconductor region.

13. The method of claim 11, further comprising, after said forming of said metal silicide layer and, before said implanting of said third dopant, forming an oxide layer on said metal silicide layer such that, during said implanting of said third dopant, said third dopant passes through said oxide layer into said metal silicide layer.

14. The method of claim 11, said first anneal process comprising a thermal anneal process performed at a first temperature and said third anneal process comprising an additional thermal anneal process performed at a second temperature that is less than said first temperature.

15. The method of claim 14, said first temperature being between 900° C. and 1150° C. and said second temperature being between 400° C. and 700° C. and less than a melting temperature of said metal silicide layer.

16. The method of claim 11, said forming of said metal silicide layer comprising forming any one of a nickel silicide layer and a nickel alloy silicide layer.

17. The method of claim 11, said third anneal process comprising any one of a thermal anneal process, a laser anneal process and a flash anneal process.

18. The method of claim 11, said third dopant being any one of the following:
    the same as said first dopant;
    different from said first dopant but with said first conductivity type;
    fluorine;
    selenium; and
    sulfur.

19. The method of claim 11, said first conductivity type comprising n-type conductivity and said third dopant comprising any one of arsenic, antimony and phosphorus.

20. The method of claim 11, said first conductivity type comprising p-type conductivity and said third dopant comprising boron.

* * * * *